(12) United States Patent
Huang et al.

(10) Patent No.: US 11,586,574 B2
(45) Date of Patent: Feb. 21, 2023

(54) UPDATABLE WIRELESS LOCAL AREA NETWORK (WLAN) CHIP

(71) Applicant: Huawei Technologies Co., Ltd., Shenzhen (CN)

(72) Inventors: Junhong Huang, Chengdu (CN); Zhaojun He, Chengdu (CN); Fan Wang, Wuhan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 5 days.

(21) Appl. No.: 17/390,365

(22) Filed: Jul. 30, 2021

(65) Prior Publication Data

US 2022/0035763 A1 Feb. 3, 2022

(30) Foreign Application Priority Data

Aug. 3, 2020 (CN) .......................... 202010768859.2

(51) Int. Cl.
*G06F 9/48* (2006.01)
*G06F 13/40* (2006.01)
*G06F 9/50* (2006.01)
*G06F 13/36* (2006.01)
*H03M 13/11* (2006.01)

(52) U.S. Cl.
CPC ........ *G06F 13/4068* (2013.01); *G06F 9/4881* (2013.01); *G06F 9/5077* (2013.01); *G06F 13/36* (2013.01); *H03M 13/1102* (2013.01)

(58) Field of Classification Search
CPC ..................................................... G06F 9/4881
See application file for complete search history.

(56) References Cited

U.S. PATENT DOCUMENTS

| 10,691,597 | B1 | 6/2020 | Akkary et al. | |
| 2018/0006806 | A1 | 1/2018 | Wang | |
| 2018/0095750 | A1 | 4/2018 | Drysdale et al. | |
| 2020/0133735 | A1 | 4/2020 | Zhao et al. | |
| 2021/0326174 | A1* | 10/2021 | Nandan | G06F 9/4881 |
| 2022/0188155 | A1* | 6/2022 | Miniskar | G06F 9/4881 |

OTHER PUBLICATIONS

Liu, W., et al.,"Distributed Sensor Network-on-Chip for Performance Optimization of Soft-Error-Tolerant Multiprocessor System-on-Chip",IEEE Transactions on Very Large Scale Integration (VLSI) Systems (vol. 24, Issue: 4), Apr. 2016, 14 pages.

* cited by examiner

*Primary Examiner* — David E Martinez
(74) *Attorney, Agent, or Firm* — Conley Rose, P.C.

(57) ABSTRACT

A chip includes a dedicated scheduler, a general scheduler, and a plurality of hardware accelerators. The hardware accelerators are connected, at least one hardware accelerator is connected to the dedicated scheduler, and at least one hardware accelerator is connected to the general scheduler.

22 Claims, 3 Drawing Sheets

UPDATABLE WIRELESS LOCAL AREA NETWORK (WLAN) CHIP

CROSS-REFERENCE TO RELATED APPLICATIONS

This claims priority to Chinese Patent App. No. 202010768859.2, filed on Aug. 3, 2020, which is incorporated by reference.

FIELD

This disclosure relates to the field of electronic technologies, and in particular, to a chip.

BACKGROUND

A wireless local area network (WLAN) technology is a popular wireless communications technology, and WLAN technical standards have been updated for many generations. When launching new WLAN chips, to ensure competitiveness, chip manufacturers hope that the new WLAN chips are compatible with existing technical standards and existing devices are fully used, and that the new WLAN chips support updates of the technical standards.

SUMMARY

This disclosure provides a chip, to provide processing flexibility while ensuring processing efficiency.

The chip includes a dedicated scheduler, a general scheduler, and a plurality of hardware accelerators. Any two of the plurality of hardware accelerators are coupled to each other. At least one of the plurality of hardware accelerators is coupled to the dedicated scheduler. At least one of the plurality of hardware accelerators is coupled to the general scheduler.

The chip may be a communications chip, for example, a WLAN chip or a base station chip.

A hardware accelerator, or hardware accelerator core (HAC), is a functional circuit, and is configured to implement functions. For example, the plurality of hardware accelerators may include one or more of the following: a fast Fourier transform (FFT) circuit, a channel estimator, a linear equalizer, a maximum likelihood estimation equalizer, a low-density parity check (LDPC) decoder, and a binary convolutional code (binary convolutional code, BCC) decoder.

The dedicated scheduler is a processing circuit designed for a specific purpose. A processing procedure of the dedicated scheduler cannot be changed and can be selected only from a limited quantity of combinations. For example, the dedicated scheduler may be an application-specific integrated circuit (ASIC). The dedicated scheduler has a relatively fixed processing procedure, and processing efficiency of the dedicated scheduler is relatively high. The dedicated scheduler can support released technical standards.

The dedicated scheduler includes a plurality of circuits. The plurality of circuits are configured to complete a plurality of different fixed processing procedures. Each of the plurality of circuits is configured to sequentially invoke at least two of the plurality of hardware accelerators according to a corresponding fixed processing procedure.

The general scheduler is a processing circuit, and a processing procedure of the general scheduler can be changed through software programming. For example, the general scheduler may be a processor with a software programmable microprocessor core, such as a central processing unit (CPU) or a field-programmable gate array (FPGA). The general scheduler has a relatively flexible processing procedure, and a hardware design defect can be overcome through software programming to improve performance. The general scheduler can support updates of the technical standards.

The general scheduler includes a processor and a memory. The memory is configured to store a scheduling program. The processor is configured to execute the scheduling program to sequentially invoke at least two of the plurality of hardware accelerators according to a processing procedure indicated by the scheduling program.

Any two of the plurality of hardware accelerators are coupled to each other. For example, the plurality of hardware accelerators are soft connected. In other words, any two of the plurality of hardware accelerators can be connected to each other. For example, all of the plurality of hardware accelerators are connected to a bus.

At least one of the plurality of hardware accelerators is coupled to the dedicated scheduler. For example, at least one of the plurality of hardware accelerators may be hard connected or soft connected to the dedicated scheduler. For example, at least one of the plurality of hardware accelerators is connected to the dedicated scheduler through a wire, or at least one of the plurality of hardware accelerators and the dedicated scheduler are all connected to a bus.

At least one of the plurality of hardware accelerators is coupled to the general scheduler. For example, at least one of the plurality of hardware accelerators may be hard connected or soft connected to the general scheduler. For example, at least one of the plurality of hardware accelerators is connected to the general scheduler through a wire, or at least one of the plurality of hardware accelerators and the general scheduler are all connected to a bus.

The dedicated scheduler has a relatively fixed processing procedure, and processing efficiency is relatively high. The general scheduler has a relatively flexible processing procedure, and a hardware design defect can be overcome through software programming to improve performance. Therefore, processing flexibility of the chip can be achieved while processing efficiency of the chip is ensured. In addition, both the dedicated scheduler and the general scheduler can schedule the plurality of hardware accelerators. Because the dedicated scheduler can be compatible with released technical standards, and the general scheduler can support updates of the technical standards, adaptability of application scenarios and performance stability of the chip can be enhanced.

Further, the dedicated scheduler can be coupled to the general scheduler, and the dedicated scheduler and the general scheduler are configured to collaboratively schedule the plurality of hardware accelerators.

The dedicated scheduler is coupled to the general scheduler. For example, the dedicated scheduler and the general scheduler may be hard connected or soft connected. For example, the dedicated scheduler is connected to the general scheduler through a wire, or both the dedicated scheduler and the general scheduler are connected to a bus.

Optionally, the dedicated scheduler is configured to determine, based on data status information sent by a first hardware accelerator in the plurality of hardware accelerators, that the dedicated scheduler continues scheduling a hardware accelerator or indicate the general scheduler to schedule a hardware accelerator.

The dedicated scheduler and the general scheduler collaboratively performs scheduling. In common application scenarios, the dedicated scheduler performs scheduling; and in special application scenarios, the general scheduler performs scheduling. In this way, the dedicated scheduler can ensure a time constraint and a processing speed, and the general scheduler can handle special problems and enhance functions. In this case, because the general scheduler is responsible for scheduling only in the special application scenarios, load of the general scheduler is low and performance is relatively stable. In addition, for a special application scenario that is not completely covered when the chip is designed, processing can be performed by the general scheduler through software simulation, to improve chip performance. In addition, even if the hardware accelerator has a design defect, output data of the hardware accelerator with the design defect can be refined by using the general scheduler. This can reduce development difficulties of the chip, reduce technical risks, and shorten a development cycle of the chip.

For example, the dedicated scheduler is configured to: when the data status information satisfies a first condition, enable a second hardware accelerator in the plurality of hardware accelerators based on the data status information, and indicate the first hardware accelerator to send output data to the second hardware accelerator.

The first condition is used to indicate that the dedicated scheduler is capable of processing the output data in this data status. For example, the first condition may be that no data processing error occurs, or that a data processing error occurs and an error cause is a specified cause. When the data status information satisfies the first condition, it indicates that the dedicated scheduler has a capability of continuing scheduling a hardware accelerator to process the output data of the first hardware accelerator. In this case, the dedicated scheduler may select, from the plurality of hardware accelerators based on the data status information, the second hardware accelerator that can continue processing the output data, and indicate the first hardware accelerator to send the output data to the second hardware accelerator for processing.

For example, the dedicated scheduler is configured to send the data status information to the general scheduler when the data status information satisfies a second condition. The general scheduler is configured to schedule a hardware accelerator based on the data status information.

The second condition is used to indicate that the dedicated scheduler is incapable of processing the output data in this data status. For example, the second condition may be that a data processing error occurs and an error cause is a cause other than a specified cause. When the data status information satisfies the second condition, it indicates that the dedicated scheduler does not have a capability of continuing scheduling a hardware accelerator to process the output data of the first hardware accelerator. In this case, the dedicated scheduler may send the data status information to the general scheduler, and the general scheduler continues to schedule a hardware accelerator based on the data status information.

DETAILED DESCRIPTION

To make the objectives, technical solutions, and advantages of this disclosure clearer, the following further describes the implementations in detail with reference to the accompanying drawings.

It should be understood that "at least one" means one or more, and "a plurality of" means two or more. The term "include" is intended to cover a non-exclusive inclusion, which means that other elements are included in addition to the mentioned elements. "A and/or B" means A, B, or A and B. The term "coupling" indicates an electrical connection or electrical coupling, which includes a direct connection through a wire or through another element. In addition, for convenience of clear description of the technical solutions, terms such as "first" and "second" are used to distinguish between same objects or similar objects whose functions and purposes are basically the same. A person skilled in the art may understand that the terms such as "first" and "second" do not limit a quantity and an execution sequence, and the terms such as "first" and "second" do not indicate a definite difference.

Before the embodiments are explained in detail, concepts related to the embodiments are first described.

A hard scheduler may be referred to as a dedicated scheduler. The dedicated scheduler is designed for a specific purpose. Once the hard scheduler is designed, a processing procedure of the dedicated scheduler cannot be changed and can be selected only from a limited quantity of combinations.

A soft scheduler may be referred to as a general scheduler. A processing procedure can be changed through software programming after the soft scheduler is designed.

A hard connection means that modules are connected through a physical wire. Once a connection relationship is determined, the connection relationship cannot be changed and can be selected only from a limited quantity of combinations. For example, modules are connected through a wire.

A soft connection means that a connection relationship between modules can be changed and the connection relationship can be changed through software programming. For example, when modules are connected to a bus and different addresses are configured for the modules, the modules can communicate with each other according to the addresses.

The following describes application scenarios related to the embodiments.

A WLAN technology is a popular wireless communications technology, and WLAN technical standards have been updated for many generations. Currently, chip manufacturers have two implementation solutions for manufacturing WLAN chips.

Full hardware implementation solution: Specifically, a chip includes a plurality of hardware accelerators and a dedicated scheduler, and the plurality of hardware accelerators are connected to each other through a wire. Each of the plurality of hardware accelerators is connected to the dedicated scheduler through a wire. The dedicated scheduler can schedule the plurality of hardware accelerators.

In this implementation solution, an energy efficiency ratio of the chip is high. In other words, a same function can be implemented using a minimum area. However, this implementation solution has the following problems. 1. High development difficulties: For a chip with a complex technical standard, the technical standard and each test detail need to be carefully clarified. 2. High technical risks: Application scenarios of the chip need to be considered when the chip is designed, and the chip needs to be redesigned in case of minor errors. 3. No upgrade: For application scenarios that are not considered when the chip is designed, chip performance cannot be improved when the chip performance deteriorates, a next-generation chip has to be launched, and consequently the chip has a relatively short life cycle.

Full software implementation solution: Specifically, a chip includes a plurality of hardware accelerators and a general scheduler, and the plurality of hardware accelerators and the general scheduler are all connected to an internal bus of the chip. The general scheduler can schedule the plurality of hardware accelerators.

In this implementation solution, if the hardware accelerator has a design defect, the general scheduler can overcome the defect through software intervention. In addition, if an original design does not cover some application scenarios, the general scheduler can improve performance through software simulation. However, this implementation solution has the following problems. 1. Because a software processing delay of the general scheduler relates to an internal operating system, the software processing delay is unpredictable, and jitter may occur. 2. In some application scenarios with strict time constraint requirements, software processing may not satisfy the requirements, and consequently high costs are incurred during subsequent commissioning and fault locating.

Therefore, the embodiments provide a chip, to resolve the problems that development difficulties are high, technical risks are high, and no upgrade can be performed in the full hardware implementation solution, and the problems that load is high and performance is unstable in the full software implementation solution.

The following describes in detail the chip provided in the embodiments.

Figure 1:
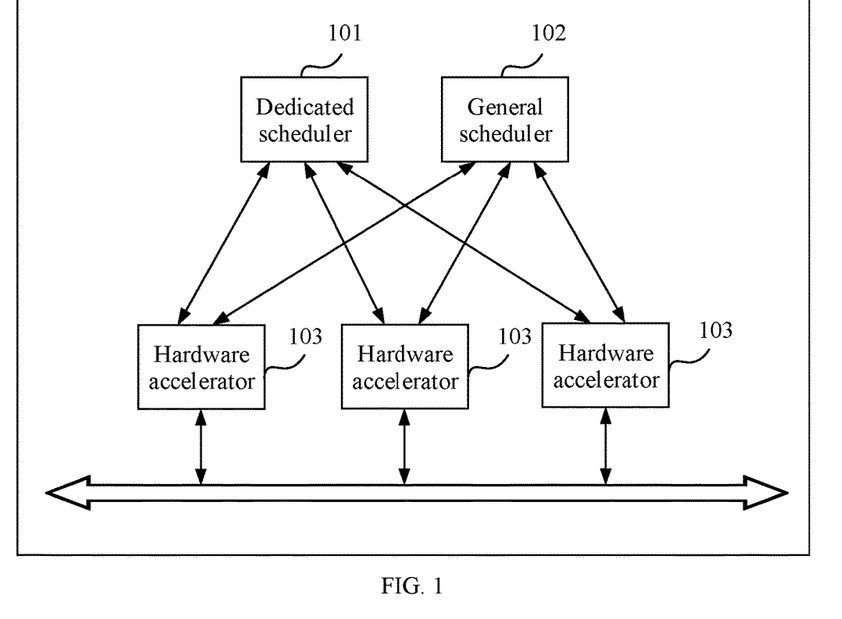
FIG. 1 is a schematic structural diagram of a first chip according to an embodiment.
Figure 2:
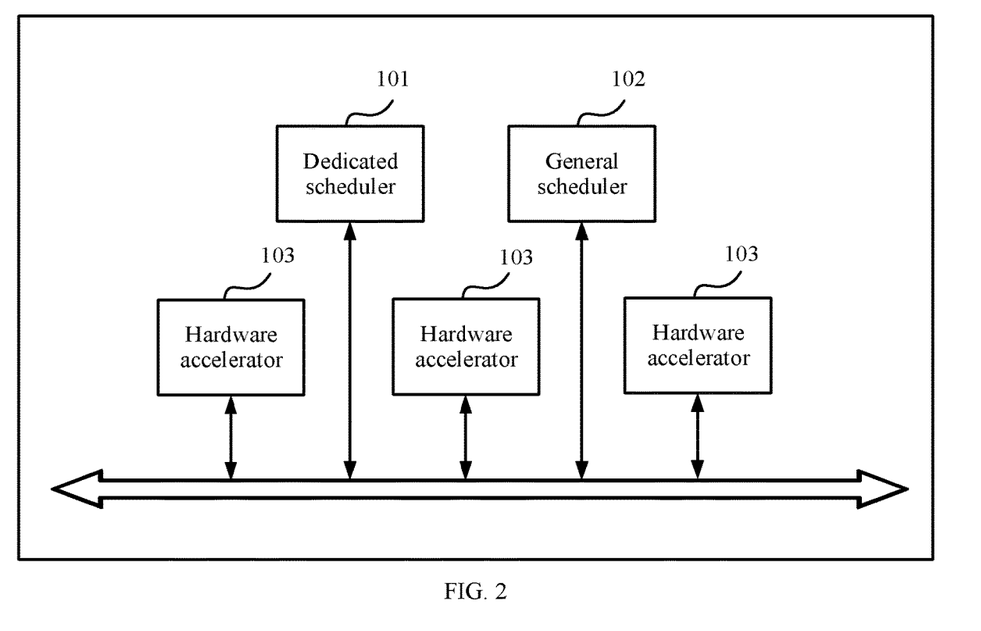
FIG. 2 is a schematic structural diagram of a second chip according to an embodiment.

FIG. 1 or FIG. 2 is a schematic structural diagram of a chip according to an embodiment. Refer to FIG. 1 or FIG. 2. The chip includes a dedicated scheduler 101, a general scheduler 102, and a plurality of hardware accelerators 103.

Any two of the plurality of hardware accelerators 103 are coupled to each other. At least one of the plurality of hardware accelerators 103 is coupled to the dedicated scheduler 101. At least one of the plurality of hardware accelerators 103 is coupled to the general scheduler 102.

The hardware accelerator 103 is a functional circuit, and is configured to implement functions. For example, the plurality of hardware accelerators 103 may include one or more of the following: an FFT circuit, a channel estimator, a linear equalizer, a maximum likelihood estimation equalizer, an LDPC decoder, and a BCC decoder.

The dedicated scheduler 101 is a processing circuit designed for a specific purpose. A processing procedure of the dedicated scheduler cannot be changed and can be selected only from a limited quantity of combinations. For example, the dedicated scheduler 101 may be an ASIC or the like. The dedicated scheduler 101 has a relatively fixed processing procedure, and processing efficiency of the dedicated scheduler 101 is relatively high. The dedicated scheduler 101 can support released technical standards.

The general scheduler 102 is a processing circuit, and a processing procedure of the general scheduler 102 can be changed through software programming. For example, the general scheduler 102 may be a processor with a software programmable microprocessor core, such as a CPU or an FPGA. The general scheduler 102 has a relatively flexible processing procedure, and a hardware design defect can be overcome through software programming to improve performance. The general scheduler 102 can support updates of the technical standards.

Any two of the plurality of hardware accelerators 103 are coupled to each other. For example, the plurality of hardware accelerators 103 are soft connected. In other words, any two of the plurality of hardware accelerators 103 can be connected to each other. For example, as shown in FIG. 1 or FIG. 2, all of the plurality of hardware accelerators 103 are connected to a bus. In this case, different addresses may be configured for the plurality of hardware accelerators 103, and any two of the plurality of hardware accelerators 103 can implement communication with each other based on the addresses. Certainly, the plurality of hardware accelerators 103 may alternatively be soft connected to each other in another manner. This is not uniquely limited in this embodiment.

At least one of the plurality of hardware accelerators 103 is coupled to the dedicated scheduler 101. For example, at least one of the plurality of hardware accelerators 103 may be hard connected or soft connected to the dedicated scheduler 101. For example, as shown in FIG. 1, at least one of the plurality of hardware accelerators 103 is connected to the dedicated scheduler 101 through a wire. In this case, any one of the at least one hardware accelerator 103 and the dedicated scheduler 101 can communicate with each other through the wire. For example, as shown in FIG. 2, at least one of the plurality of hardware accelerators 103 and the dedicated scheduler 101 are connected to a bus. In this case, different addresses may be configured for the at least one hardware accelerator 103 and the dedicated scheduler 101, and the at least one hardware accelerator 103 and the dedicated scheduler 101 can implement communication with each other based on the addresses. Certainly, the at least one of the plurality of hardware accelerators 103 and the dedicated scheduler 101 may alternatively be hard connected or soft connected in another manner. This is not uniquely limited in this embodiment.

At least one of the plurality of hardware accelerators 103 is coupled to the general scheduler 102. For example, at least one of the plurality of hardware accelerators 103 may be hard connected or soft connected to the general scheduler 102. For example, as shown in FIG. 1, at least one of the plurality of hardware accelerators 103 is connected to the general scheduler 102 through a wire. In this case, any one of the at least one hardware accelerator 103 and the general scheduler 102 can communicate with each other through the wire. For example, as shown in FIG. 2, at least one of the plurality of hardware accelerators 103 and the general scheduler 102 are connected to a bus. In this case, different addresses may be configured for the at least one hardware accelerator 103 and the general scheduler 102, and the at least one hardware accelerator 103 and the general scheduler 102 can implement communication with each other based on the addresses. Certainly, the at least one of the plurality of hardware accelerators 103 and the general scheduler 102 may alternatively be hard connected or soft connected in another manner. This is not uniquely limited in this embodiment.

Figure 3:
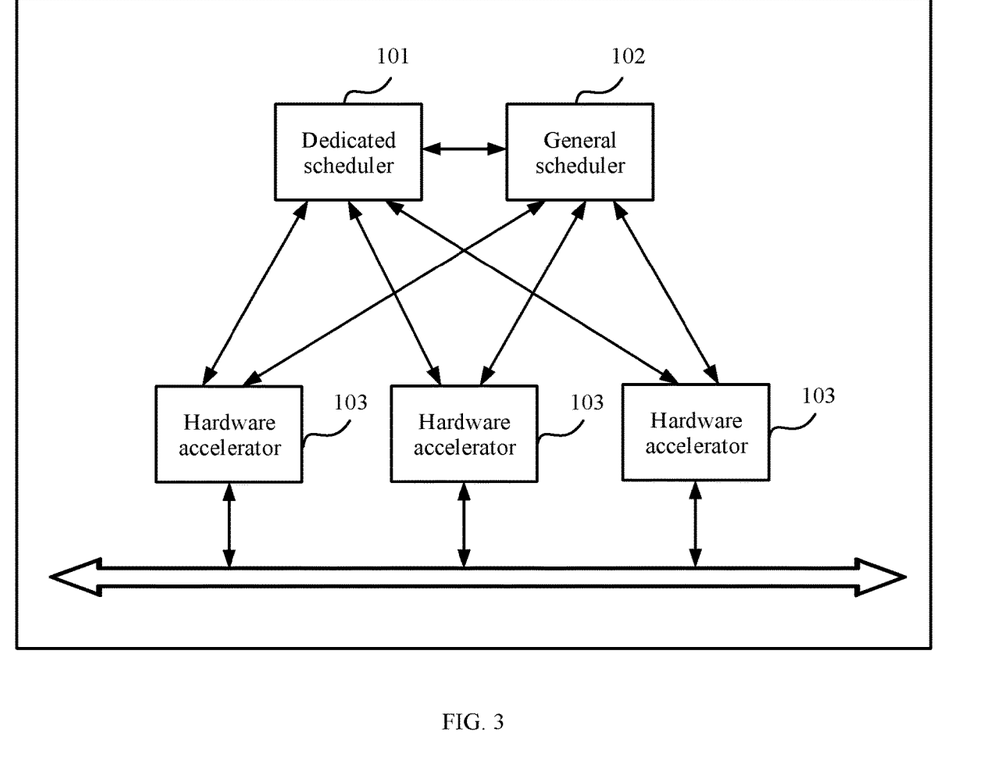
FIG. 3 is a schematic structural diagram of a third chip according to an embodiment.

Further, refer to FIG. 2 or FIG. 3. The dedicated scheduler 101 may be coupled to the general scheduler 102. For example, the dedicated scheduler 101 and the general scheduler 102 may be hard connected or soft connected. For example, as shown in FIG. 3, the dedicated scheduler 101 and the general scheduler 102 are connected through a wire. In this case, the dedicated scheduler 101 and the general scheduler 102 may communicate with each other through the wire. For another example, as shown in FIG. 2, both the dedicated scheduler 101 and the general scheduler 102 are connected to a bus. In this case, different addresses may be configured for the dedicated scheduler 101 and the general scheduler 102; and the dedicated scheduler 101 and the general scheduler 102 can implement communication with each other based on the addresses. Certainly, the dedicated scheduler 101 and the general scheduler 102 may alternatively be hard connected or soft connected in another manner. This is not uniquely limited in this embodiment.

When the two modules are hard connected, the hard connection between the two modules is used for communication only between the two modules. One of the two modules can directly send data to the other module through the hard connection. For example, when two modules are connected through a wire, for example, when the hardware accelerator 103 and the dedicated scheduler 101 are connected through a wire, or when the hardware accelerator 103 and the general scheduler 102 are connected through a wire, or when the dedicated scheduler 101 and the general scheduler 102 are connected through a wire, the wire is used for communication only between the two modules. One of the two modules can directly send data to the other module through the connected wire.

When the modules are soft connected, for example, when all of the plurality of hardware accelerators 103 are connected to a bus, if a hardware accelerator 103 and the dedicated scheduler 101 are also connected to a bus, the bus to which all of the plurality of hardware accelerators 103 are connected and the bus to which the hardware accelerator 103 and the dedicated scheduler 101 are connected may be a same bus or certainly may be different buses. This is not uniquely limited in this embodiment.

When the modules are soft connected, for example, when all of the plurality of hardware accelerators 103 are connected to a bus, if a hardware accelerator 103 and the general scheduler 102 are also connected to a bus, the bus to which all of the plurality of hardware accelerators 103 are connected and the bus to which the hardware accelerator 103 and the general scheduler 102 are connected may be a same bus or certainly may be different buses. This is not uniquely limited in this embodiment.

When the modules are soft connected, for example, when all of the plurality of hardware accelerators 103 are connected to a bus, if a dedicated scheduler 101 and the general scheduler 102 are also connected to a bus, the bus to which all of the plurality of hardware accelerators 103 are connected and the bus to which the dedicated scheduler 101 and the general scheduler 102 are connected may be a same bus or certainly may be different buses. This is not uniquely limited in this embodiment.

When the modules are soft connected, for example, when all of the plurality of hardware accelerators 103 are connected to a bus, if a hardware accelerator 103 and the dedicated scheduler 101 are also connected to a bus, the hardware accelerator 103 and the general scheduler 102 are also connected to a bus, the dedicated scheduler 101 and the general scheduler 102 are also connected to a bus, the bus to which all of the plurality of hardware accelerators 103 are connected, the bus to which the hardware accelerator 103 and the dedicated scheduler 101 are connected, the bus to which the hardware accelerator 103 and the general scheduler 102 are connected, and the bus to which the dedicated scheduler 101 and the general scheduler 102 are connected may be a same bus or certainly may be different buses. This is not uniquely limited in this embodiment.

When the module is connected to a bus, for example, when the hardware accelerator 103 is connected to a bus, or the dedicated scheduler 101 is connected to a bus, or the general scheduler 102 is connected to a bus, for a manner in which the module is connected to the bus, refer to related technologies. This is not described in detail in this embodiment. For example, the bus may include a bus controller, a bus transceiver, and a physical bus. The module may be connected to the bus controller, and the bus controller may be connected to the physical bus through the bus transceiver, to implement a connection of the module to the bus.

A hardware accelerator 103 in the plurality of hardware accelerators 103 may not only include an interface for communicating with another hardware accelerator 103, an interface for communicating with the dedicated scheduler 101, and an interface for communicating with the general scheduler 102, but also may include another interface, for example, a network interface for communicating with outside the chip.

In addition, an input end of the first hardware accelerator 103 in the plurality of hardware accelerators 103 may be an input interface of the chip, and is configured to receive data input from outside the chip; and an output end of the last hardware accelerator 103 in the plurality of hardware accelerators 103 may be an output interface of the chip, and is configured to output data to outside the chip.

Both the dedicated scheduler 101 and the general scheduler 102 can schedule the hardware accelerator 103. The following describes processes in which the dedicated scheduler 101 and the general scheduler 102 schedule the hardware accelerator 103.

The dedicated scheduler 101 includes a plurality of circuits, and the plurality of circuits are configured to complete a plurality of different fixed processing procedures. Each of the plurality of circuits is configured to sequentially invoke at least two of the plurality of hardware accelerators 103 according to a corresponding fixed processing procedure.

The general scheduler 102 includes a processor and a memory. The memory is configured to store a scheduling program. The processor is configured to execute the scheduling program to sequentially invoke at least two of the plurality of hardware accelerators 103 according to a processing procedure indicated by the scheduling program.

In this embodiment, both the dedicated scheduler 101 and the general scheduler 102 can schedule the plurality of hardware accelerators 103. Because the dedicated scheduler 101 can be compatible with released technical standards, and the general scheduler 102 can support updates of the technical standards, adaptability of application scenarios and performance stability of the chip can be enhanced.

The dedicated scheduler 101 or the general scheduler 102 can enable the hardware accelerator 103. After being enabled, the hardware accelerator 103 may process input data. The dedicated scheduler 101 or the general scheduler 102 may indicate the hardware accelerator 103 to output processed data to another hardware accelerator 103 or output processed data to outside the chip.

The dedicated scheduler 101 and the general scheduler 102 each independently schedule the plurality of hardware accelerators 103. This scheduling manner is described below.

If data needs to be input into the chip for processing, the data may include indication information, and the indication information is used to indicate whether the dedicated scheduler 101 needs to schedule a hardware accelerator or the general scheduler 102 needs to schedule a hardware accelerator. For example, the dedicated scheduler 101 may schedule a hardware accelerator when processing data that satisfies released technical standards, and the general scheduler 102 may schedule a hardware accelerator when processing data that satisfies latest updated technical standards.

In this case, if the indication information in the data indicates that the dedicated scheduler 101 needs to schedule a hardware accelerator, after the data is input into the chip, the dedicated scheduler 101 may schedule the plurality of hardware accelerators 103, to control the plurality of hardware accelerators 103 to complete processing of the data.

For example, for any one of the plurality of hardware accelerators 103, if the hardware accelerator 103 receives input data, the hardware accelerator 103 processes the input data to obtain output data and data status information. The hardware accelerator 103 sends the data status information to the dedicated scheduler 101. The dedicated scheduler 101 enables another hardware accelerator 103 in the plurality of hardware accelerators 103 based on the data status information, and indicates the hardware accelerator 103 to send the output data to the another hardware accelerator 103 as input data of the another hardware accelerator 103. The another hardware accelerator 103 continues to perform processing. The data status information may include a data processing status, a data parameter status, and the like. The data processing status is used to indicate whether an error occurs in data processing of the hardware accelerator 103. When an error occurs in data processing of the hardware accelerator 103, the data processing status may further include an error cause and the like. The data parameter status includes various parameters of the output data of the hardware accelerator 103. For example, the data parameter state may include a signal-to-noise ratio of the output data of the hardware accelerator 103, a quantity of streams, and the like.

For example, the dedicated scheduler 101 may select to switch a data processing path based on the data status information. To be specific, the dedicated scheduler 101 may select, based on the data status information, to enable a next hardware accelerator 103 of the hardware accelerator 103, or select to skip a next hardware accelerator 103 of the hardware accelerator 103 and enable another post-level hardware accelerator 103.

For example, the dedicated scheduler 101 may adjust, based on the data status information, a working parameter of the post-level hardware accelerator 103 that is configured to continue to process data. To be specific, after enabling another hardware accelerator 103 based on the data status information, the dedicated scheduler 101 may first adjust the working parameter of the another hardware accelerator 103, and then indicate the hardware accelerator 103 to send the output data to the another hardware accelerator 103 for processing.

If the indication information in the data indicates that the general scheduler 102 needs to schedule a hardware accelerator, after the data is input into the chip, the general scheduler 102 may schedule the plurality of hardware accelerators 103, to control the plurality of hardware accelerators 103 to complete processing of the data.

For example, for any one of the plurality of hardware accelerators 103, if the hardware accelerator 103 receives input data, the hardware accelerator 103 processes the input data to obtain output data and data status information. The hardware accelerator 103 sends the data status information to the general scheduler 102.

In a possible implementation, after receiving the data status information, the general scheduler 102 may enable another hardware accelerator 103 in the plurality of hardware accelerators 103 based on the data status information, and indicates the hardware accelerator 103 to send the output data to the another hardware accelerator as input data of the another hardware accelerator 103. The another hardware accelerator 103 continues to perform processing.

For example, the general scheduler 102 may select to switch a data processing path based on the data status information. To be specific, the general scheduler 102 may select, based on the data status information, to enable a next hardware accelerator 103 of the hardware accelerator 103, or select to skip a next hardware accelerator 103 of the hardware accelerator 103 and enable another post-level hardware accelerator 103.

For example, the general scheduler 102 may adjust, based on the data status information, a working parameter of the post-level hardware accelerator 103 that is configured to continue to process data. To be specific, after enabling another hardware accelerator 103 based on the data status information, the general scheduler 102 may first adjust the working parameter of the another hardware accelerator 103, and then indicate the hardware accelerator 103 to send the output data to the another hardware accelerator 103 for processing.

In another possible implementation, the general scheduler 102 may obtain output data of the hardware accelerator 103 based on the data status information, and process the output data to obtain processed data. Then, the general scheduler 102 enables another hardware accelerator 103 in the plurality of hardware accelerators 103 based on the processed data, and sends the processed data to the another hardware accelerator 103 for processing.

For example, the general scheduler 102 may select to switch a data processing path based on the processed data. To be specific, the general scheduler 102 may select, based on the processed data, to enable a next hardware accelerator 103 of the hardware accelerator 103, or select to skip a next hardware accelerator 103 of the hardware accelerator 103 and enable another post-level hardware accelerator 103.

For example, the general scheduler 102 may adjust, based on the processed data, a working parameter of the post-level hardware accelerator 103 that is configured to continue to process data. To be specific, after enabling another hardware accelerator 103 based on the processed data, the general scheduler 102 may first adjust the working parameter of the another hardware accelerator 103, and then send the processed data to the another hardware accelerator 103 for processing.

The dedicated scheduler 101 and the general scheduler 102 may collaboratively schedule the plurality of hardware accelerators 103. In this case, the dedicated scheduler 101 needs to be coupled to the general scheduler 102. This scheduling manner is described below.

The dedicated scheduler 101 can schedule the plurality of hardware accelerators 103 in a common application scenario. For example, the dedicated scheduler 101 can schedule the plurality of hardware accelerators 103 under released technical standards. The plurality of hardware accelerators 103 can collaborate with the dedicated scheduler 101 to implement basic functions. For example, the dedicated scheduler 101 sequentially invokes the plurality of hardware accelerators 103 to work. After completing data processing, each hardware accelerator 103 notifies the dedicated scheduler 101, and the dedicated scheduler 101 accordingly enables a post-level hardware accelerator 103.

The general scheduler 102 can schedule the plurality of hardware accelerators 103 in a special application scenario. For example, the general scheduler 102 can schedule the plurality of hardware accelerators 103 under latest updated technical standards. The special application scenario may be an application scenario that is not considered when the dedicated scheduler 101 is designed, or an application scenario in which the dedicated scheduler 101 cannot perform processing. For example, when detecting that a current data processing status of the hardware accelerator 103 is abnormal, the dedicated scheduler 101 notifies the general scheduler 102 to perform subsequent scheduling of a hardware accelerator 103.

In other words, the dedicated scheduler 101 and the general scheduler 102 collaboratively performs scheduling. In common application scenarios, the dedicated scheduler 101 performs scheduling; and in special application scenarios, the general scheduler 102 performs scheduling. In this way, the dedicated scheduler 101 can ensure a time constraint and a processing speed, and the general scheduler 102 can handle special problems and enhance functions. In this case, because the general scheduler 102 is responsible for scheduling only in special application scenarios, load of the general scheduler 102 is low and performance is relatively stable. In addition, for a special application scenario that is not completely covered when the chip is designed, processing can be performed by the general scheduler 102 through software simulation, to improve chip performance. In addition, even if the hardware accelerator 103 has a design defect, output data of the hardware accelerator 103 with the design defect can be refined by using the general scheduler 102. This can reduce development difficulties of the chip, reduce technical risks, and shorten a development cycle of the chip.

The following describes specific operations that the dedicated scheduler 101 and the general scheduler 102 collaboratively schedule the plurality of hardware accelerators 103.

When the dedicated scheduler 101 performs scheduling, data input into the chip this time may be sequentially processed by the plurality of hardware accelerators 103. To be specific, after a hardware accelerator 103 processes the input data to obtain output data, under control of the dedicated scheduler 101, the hardware accelerator 103 sends the output data to a next hardware accelerator 103 as input data of the next hardware accelerator 103, and the next hardware accelerator 103 continues to perform processing.

In this case, for any one of the plurality of hardware accelerators 103, for example, for a first hardware accelerator 103, if the first hardware accelerator 103 obtains output data and data status information after processing the input data, the first hardware accelerator 103 may send the data status information to the dedicated scheduler 101. When sending the data status information to the dedicated scheduler 101, the first hardware accelerator 103 may send the data status information to the dedicated scheduler 101 in an interrupt or a message manner. This is not uniquely limited in this embodiment.

The dedicated scheduler 101 may determine, based on the data status information sent by the first hardware accelerator 103, that the dedicated scheduler 101 continues scheduling a hardware accelerator or indicate the general scheduler 102 to schedule a hardware accelerator. Specific operations are as follows:

When the data status information satisfies a first condition, the dedicated scheduler 101 may enable a second hardware accelerator 103 in the plurality of hardware accelerators 103 based on the data status information, and indicate the first hardware accelerator 103 to send the output data to the second hardware accelerator 103.

The first condition is used to indicate that the dedicated scheduler 101 is capable of processing the output data in the data status. For example, the first condition may be that no data processing error occurs, or that a data processing error occurs and an error cause is a specified cause. When the data status information satisfies the first condition, it indicates that the dedicated scheduler 101 has a capability of continuing scheduling a hardware accelerator 103 to process the output data of the first hardware accelerator 103. In this case, the dedicated scheduler 101 may select, from the plurality of hardware accelerators 103 based on the data status information, the second hardware accelerator 103 that can continue processing the output data, and indicate the first hardware accelerator 103 to send the output data to the second hardware accelerator 103 for processing.

For example, the dedicated scheduler 101 may select to switch a data processing path based on the data status information. To be specific, the dedicated scheduler 101 may select, based on the data state information, to enable a next hardware accelerator 103 of the first hardware accelerator 103 (that is, the next hardware accelerator 103 is used as the second hardware accelerator 103), or select to skip a next hardware accelerator 103 of the first hardware accelerator 103 and enable another post-level hardware accelerator 103 (that is, the another post-level hardware accelerator 103 is used as the second hardware accelerator 103).

For example, the dedicated scheduler 101 may adjust, based on the data status information, a working parameter of the post-level hardware accelerator 103 that is configured to continue to process data. To be specific, after enabling the second hardware accelerator 103 based on the data status information, the dedicated scheduler 101 may first adjust the working parameter of the second hardware accelerator 103, and then indicate the hardware accelerator 103 to send the output data to the second hardware accelerator 103 for processing.

The dedicated scheduler 101 may send the data status information to the general scheduler 102 when the data status information satisfies a second condition. The general scheduler 102 may schedule a hardware accelerator based on the data status information.

The second condition is used to indicate that the dedicated scheduler 101 is incapable of processing the output data in the data status. For example, the second condition may be that a data processing error occurs and an error cause is a cause other than a specified cause. When the data status information satisfies the second condition, it indicates that the dedicated scheduler 101 does not have a capability of continuing scheduling a hardware accelerator 103 to process the output data of the first hardware accelerator 103. In this case, the dedicated scheduler 101 may send the data status information to the general scheduler 102, and the general scheduler 102 continues to schedule a hardware accelerator based on the data status information.

After receiving the data status information, the general scheduler 102 may select an appropriate scheduling manner based on the data status information.

In a possible implementation, the general scheduler 102 may enable a third hardware accelerator 103 in the plurality of hardware accelerators 103 based on the data status information, and indicates the first hardware accelerator 103 to send the output data to the third hardware accelerator 103 for processing.

For example, the general scheduler 102 may select to switch a data processing path based on the data status information. To be specific, the general scheduler 102 may select, based on the data state information, to enable a next hardware accelerator 103 of the first hardware accelerator 103 (that is, the next hardware accelerator 103 is used as the third hardware accelerator 103), or select to skip a next hardware accelerator 103 of the first hardware accelerator 103 and enable another post-level hardware accelerator 103 (that is, the another post-level hardware accelerator 103 is used as the third hardware accelerator 103).

For example, the general scheduler 102 may adjust, based on the data status information, a working parameter of the post-level hardware accelerator 103 that is configured to continue to process data. To be specific, after enabling the third hardware accelerator 103 based on the data status information, the general scheduler 102 may first adjust the working parameter of the third hardware accelerator 103, and then indicate the hardware accelerator 103 to send the output data to the third hardware accelerator 103 for processing.

In another possible implementation, the general scheduler 102 may obtain output data of the first hardware accelerator 103 based on the data status information, and process the output data to obtain processed data. Then, the general scheduler 102 enables a fourth hardware accelerator 103 in the plurality of hardware accelerators 103 based on the processed data, and sends the processed data to the fourth hardware accelerator 103 for processing.

For example, the general scheduler 102 may select to switch a data processing path based on the processed data. To be specific, the general scheduler 102 may select, based on the processed data, to enable a next hardware accelerator 103 of the first hardware accelerator 103 (that is, the next hardware accelerator 103 is used as the fourth hardware accelerator 103), or select to skip a next hardware accelerator 103 of the first hardware accelerator 103 and enable another post-level hardware accelerator 103 (that is, the another post-level hardware accelerator 103 is used as the fourth hardware accelerator 103).

For example, the general scheduler 102 may adjust, based on the processed data, a working parameter of the post-level hardware accelerator 103 that is configured to continue to process data. To be specific, after enabling the fourth hardware accelerator 103 based on the processed data, the general scheduler 102 may first adjust the working parameter of the fourth hardware accelerator 103, and then send the processed data to the fourth hardware accelerator 103 for processing.

It should be noted that for a hardware accelerator 103, if the dedicated scheduler 101 enables the hardware accelerator 103, the hardware accelerator 103 sends the data status information to the dedicated scheduler 101; or if the general scheduler 102 enables the hardware accelerator 103, the hardware accelerator 103 sends the data status information to the general scheduler 102.

Each time data is input into the chip, the dedicated scheduler 101 first schedules the hardware accelerator 103 to process the input data. If the dedicated scheduler 101 selects, based on the data status information sent by the hardware accelerator 103, the indicated general scheduler 102 to schedule a hardware accelerator in this data processing process, the general scheduler 102 subsequently continues to schedule a hardware accelerator to complete this data processing.

The chip provided in this embodiment may be a communications chip, for example, a WLAN chip or a base station chip. This is not uniquely limited in this embodiment.

In this embodiment, the chip includes the dedicated scheduler 101, the general scheduler 102, and the plurality of hardware accelerators 103. The plurality of hardware accelerators 103 are soft connected, at least one hardware accelerator 103 is connected to the dedicated scheduler 101, and at least one hardware accelerator 103 is connected to the general scheduler 102. The dedicated scheduler 101 has a relatively fixed processing procedure, and processing efficiency is relatively high. The general scheduler 102 has a relatively flexible processing procedure, and a hardware design defect can be overcome through software programming to improve performance. Therefore, processing flexibility of the chip can be achieved while processing efficiency of the chip is ensured.

Figure 4:
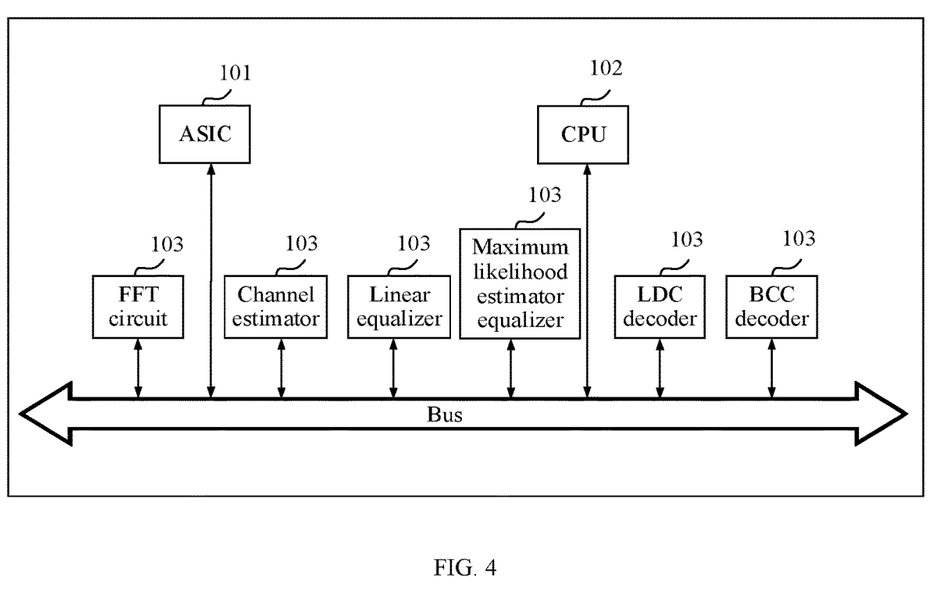
FIG. 4 is a schematic structural diagram of a fourth chip according to an embodiment.

For ease of understanding, the following provides an example with reference to a chip shown in FIG. 4. Refer to FIG. 4. The chip includes a plurality of hardware accelerators 103, a dedicated scheduler 101, and a general scheduler 102. The plurality of hardware accelerators 103 include an FFT circuit, a channel estimator, a linear equalizer, a maximum likelihood estimation equalizer, an LDPC decoder, and a BCC decoder. The dedicated scheduler 101 may be an ASIC, and the general scheduler 102 may be a CPU. The plurality of hardware accelerators 103, the dedicated scheduler 101, and the general scheduler 102 are all connected to a bus.

In a common application scenario, the dedicated scheduler 101 coordinates the hardware accelerators 103 to work together. Specifically, the FFT circuit sends the data status information to the ASIC in an interrupt or a message manner. First, the ASIC determines, based on the data processing status in the data status information, that the ASIC continues scheduling a hardware accelerator. Then, the ASIC may select to enable one of a post-level linear equalizer and a post-level maximum likelihood estimation equalizer based on the data parameter status in the data status information. And then, the ASIC indicates the FFT circuit to send output data to the selected module for processing.

In a special application scenario, the general scheduler 102 takes over scheduling of each hardware accelerator 103 according to an indication of the dedicated scheduler 101. Specifically, after the FFT circuit sends the data status information to the ASIC in an interrupt or a message manner, the ASIC determines, based on the data processing status in the data status information, that the CPU continues to schedule a hardware accelerator. The ASIC sends the data status information to the CPU. The CPU performs hardware accelerator scheduling based on the data status information. For example, the CPU may select, based on the data parameter status in the data status information, to enable one of a post-level linear equalizer and a post-level maximum likelihood estimation equalizer to continue to perform data processing. Alternatively, the CPU may simulate an equalizer by using software, process output data of the FFT circuit by using the equalizer, skip an existing linear equalizer and an existing maximum likelihood estimation equalizer, and directly invoke a post-level LDPC decoder or a post-level BCC decoder to continue to perform data processing.

The foregoing descriptions are merely embodiments, but are not intended to limit this disclosure. Any modification, equivalent replacement, or improvement made without departing from this disclosure should fall within the protection scope of this disclosure.

What is claimed is:
1. A chip comprising:
hardware accelerators, wherein two of the hardware accelerators are coupled to each other, and wherein the hardware accelerators comprise:
a first hardware accelerator, and
a second hardware accelerator;

a general scheduler coupled to the first hardware accelerator and configured to:
  change a soft scheduler processing procedure through software programming; and
  schedule the first hardware accelerator; and
a dedicated scheduler coupled to the second hardware accelerator and configured to:
  maintain all dedicated scheduler processing procedures; and
  schedule the second hardware accelerator.

2. The chip of claim 1, further comprising a bus coupled to the hardware accelerators.

3. The chip of claim 1, further comprising a wire or a bus coupled to the second hardware accelerator and the dedicated scheduler.

4. The chip of claim 1, further comprising a wire or a bus coupled to the first hardware accelerator and the general scheduler.

5. The chip of claim 1, wherein the dedicated scheduler is coupled to the general scheduler, and wherein the dedicated scheduler and the general scheduler are configured to collaboratively schedule the hardware accelerators.

6. The chip of claim 5, further comprising a wire or a bus coupling the dedicated scheduler and the general scheduler.

7. The chip of claim 5, wherein the first hardware accelerator is configured to send data status information to the dedicated scheduler, and wherein the dedicated scheduler is further configured to determine, based on the data status information, that the dedicated scheduler should continue scheduling the first hardware accelerator or should instruct the general scheduler to schedule the first hardware accelerator.

8. The chip of claim 7, wherein the dedicated scheduler is further configured to enable the second hardware accelerator based on the data status information and when the data status information satisfies a first condition.

9. The chip of claim 8, wherein the dedicated scheduler is further configured to instruct the first hardware accelerator to send output data to the second hardware accelerator when the data status information satisfies the first condition.

10. The chip of claim 7, wherein the dedicated scheduler is further configured to send the data status information to the general scheduler when the data status information satisfies a second condition.

11. The chip of claim 10, wherein the general scheduler is configured to schedule the first hardware accelerator based on the data status information.

12. The chip of claim 5, wherein the dedicated scheduler is directly coupled to the general scheduler.

13. The chip of claim 7, wherein the dedicated scheduler is further configured to receive the data status information from the first hardware accelerator.

14. The chip of claim 1, wherein the chip is a wireless local area network (WLAN) chip.

15. The chip of claim 1, wherein the hardware accelerators comprise a fast Fourier transform (FFT) circuit, a channel estimator, or a linear equalizer.

16. The chip of claim 1, wherein the dedicated scheduler comprises circuits configured to complete fixed processing procedures.

17. The chip of claim 16, wherein the circuits are further configured to sequentially invoke at least two of the hardware accelerators according to the fixed processing procedures.

18. The chip of claim 1, wherein the general scheduler comprises a memory configured to store a scheduling program indicating a processing procedure.

19. The chip of claim 18, wherein the general scheduler further comprises a processor configured to execute the scheduling program to sequentially invoke at least two of the hardware accelerators according to the processing procedure.

20. The chip of claim 1, wherein the dedicated scheduler is further configured to support released technical standards.

21. The chip of claim 20, wherein the general scheduler is further configured to support updates of the released technical standards.

22. The chip of claim 1, wherein the hardware accelerators comprise a maximum likelihood estimation equalizer, a low-density parity check (LDPC) decoder, or a binary convolutional code decoder.

* * * * *